(12) United States Patent
Amir

(10) Patent No.: US 9,740,108 B2
(45) Date of Patent: Aug. 22, 2017

(54) SCATTEROMETRY OVERLAY METROLOGY TARGETS AND METHODS

(71) Applicant: KLA-Tencor Corporation, Milpitas, CA (US)

(72) Inventor: Nuriel Amir, St. Yokne'am (IL)

(73) Assignee: KLA-Tencor Corporation, Milpitas, CA (US)

( * ) Notice: Subject to any disclaimer, the term of this patent is extended or adjusted under 35 U.S.C. 154(b) by 5 days.

(21) Appl. No.: 14/457,780

(22) Filed: Aug. 12, 2014

(65) Prior Publication Data

US 2014/0351771 A1    Nov. 27, 2014

Related U.S. Application Data

(63) Continuation of application No. PCT/US2014/039617, filed on May 27, 2014.

(60) Provisional application No. 61/827,717, filed on May 27, 2013.

(51) Int. Cl.
*G03F 7/20*    (2006.01)
*G02B 26/10*   (2006.01)

(52) U.S. Cl.
CPC ...... *G03F 7/70633* (2013.01); *G03F 7/70683* (2013.01); *G02B 26/103* (2013.01); *G03F 7/70* (2013.01); *G03F 7/7065* (2013.01); *G03F 7/70483* (2013.01)

(58) Field of Classification Search
CPC .... G03F 7/70633; G03F 7/70; G03F 7/70483; G03F 7/7065; G02B 26/103

USPC ........ 359/196.1, 223.1, 225.1; 382/144–145, 382/151; 716/50–56; 356/620
See application file for complete search history.

(56) References Cited

U.S. PATENT DOCUMENTS

| | | | |
|---|---|---|---|
| 6,856,408 B2 * | 2/2005 | Raymond ............. | G01B 11/00 356/237.5 |
| 7,898,662 B2 * | 3/2011 | Van Der Schaar . | G03F 7/70633 356/401 |
| 8,189,202 B2 * | 5/2012 | Liesener ............. | G03F 7/70633 356/508 |
| 8,264,686 B2 * | 9/2012 | Den Boef ............. | G03B 27/42 355/53 |
| 8,570,515 B2 * | 10/2013 | Abdulhalim ........ | G03F 7/70633 356/364 |
| 8,760,662 B2 * | 6/2014 | Den Boef ........... | G03F 7/70341 356/456 |
| 8,781,211 B2 * | 7/2014 | Ghinovker .......... | G03F 7/70633 382/141 |

(Continued)

FOREIGN PATENT DOCUMENTS

WO    2012080008    6/2012

*Primary Examiner* — Stacy Whitmore
(74) *Attorney, Agent, or Firm* — Suiter Swantz pc llo

(57) ABSTRACT

Scatterometry overlay (SCOL) targets as well as design, production and measurement methods thereof are provided. The SCOL targets have several periodic structures at different measurement directions which share some of their structural target elements or parts thereof. An array of common elements may have symmetry directions which are parallel to the measurement directions and thus enable compacting the targets or alternatively increasing the area use efficiency of the targets. Various configurations enable high flexibility in arranging the number of layers in the target and measurement directions, and carrying out respective overlay measurements among the layers.

26 Claims, 5 Drawing Sheets

(56) References Cited

U.S. PATENT DOCUMENTS

| | | | |
|---|---|---|---|
| 9,093,458 B2* | 7/2015 | Amir | H01L 23/544 |
| 9,255,892 B2* | 2/2016 | Van De Kerkhof | G03F 7/70633 |
| 9,476,838 B2* | 10/2016 | Choi | G01N 21/9501 |
| 2003/0095267 A1 | 5/2003 | Mieher et al. | |
| 2004/0137651 A1 | 7/2004 | Smedt et al. | |
| 2007/0222088 A1* | 9/2007 | Smith | G03F 9/7076 257/797 |
| 2008/0218767 A1 | 9/2008 | Mos et al. | |
| 2008/0311344 A1* | 12/2008 | Marie Kiers | G01N 21/4788 428/138 |
| 2011/0069314 A1* | 3/2011 | Ausschnitt | G03F 7/70633 356/401 |
| 2012/0212718 A1* | 8/2012 | Den Boef | G02B 21/0048 355/67 |
| 2013/0163852 A1* | 6/2013 | Ghinovker | G03F 7/70633 382/149 |

\* cited by examiner

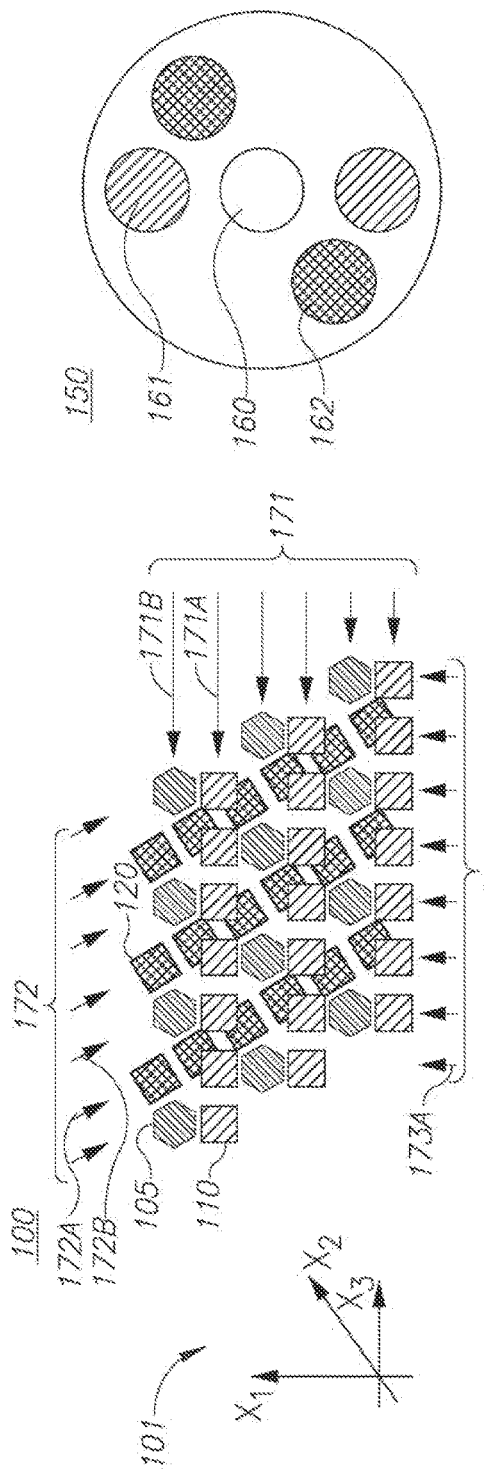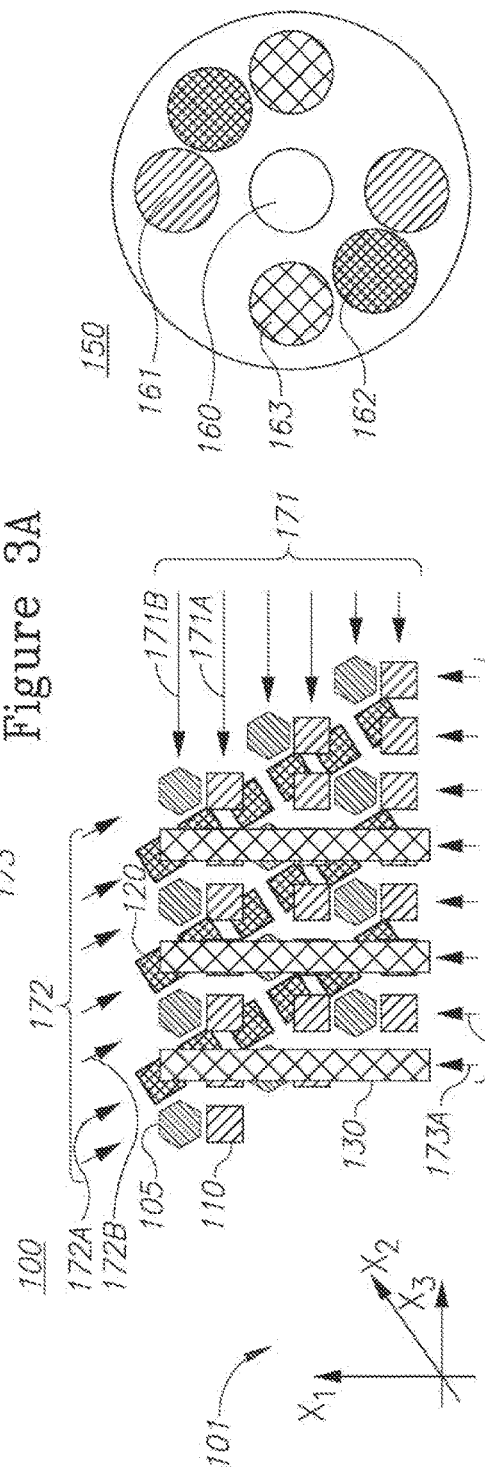
Figure 3A
Figure 3B

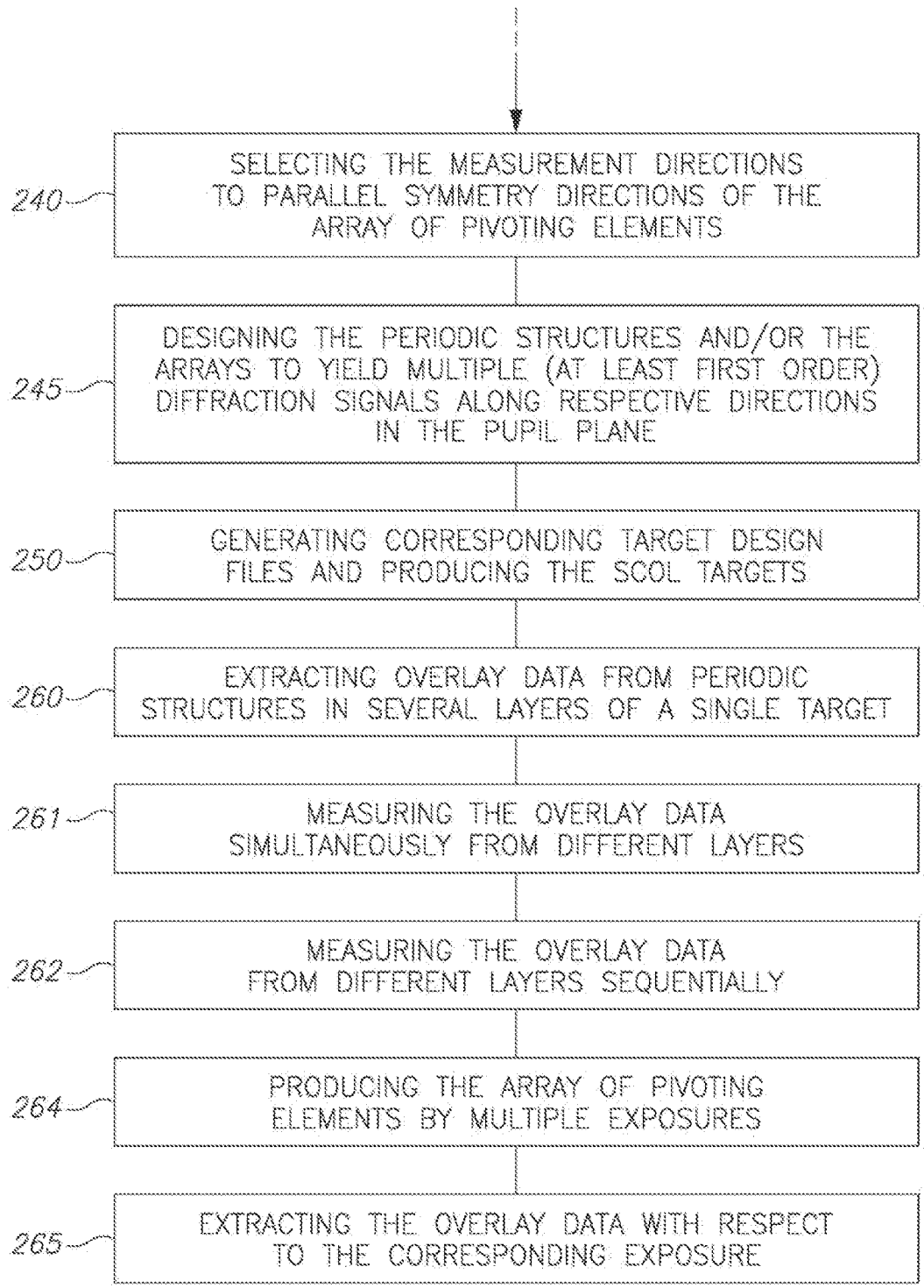
Figure 4 (cont. 1)

SCATTEROMETRY OVERLAY METROLOGY TARGETS AND METHODS

CROSS REFERENCE TO RELATED APPLICATIONS

This application is filed under 35 U.S.C. §120 and §365(c) as a continuation of International Patent Application No. PCT/US2014/039617 filed May 27, 2014, which application claims the benefit of U.S. Provisional Patent Application No. 61/827,717 filed on May 27, 2013, which applications are incorporated herein by reference in their entirety.

BACKGROUND OF THE INVENTION

1. Technical Field

The present invention relates to the field of metrology, and more particularly, to scatterometry overlay (SCOL) metrology targets.

2. Discussion of Related Art

Metrology targets are designed to enable the measurement of parameters that indicate the quality of wafer production steps and quantify the correspondence between design and implementation of structures on the wafer. Metrology targets as specific structures optimize the requirements for device similarity and for optical measurability. Scatterometry overlay (SCOL) targets are periodic structures which are used to produce diffraction patterns for metrology measurements. As wafer layers increase in number and the available space for metrology targets decreases, there is a constant requirement for more efficient use of target space.

SUMMARY OF THE INVENTION

One aspect of the present invention provides a scatterometry overlay (SCOL) target comprising at least two periodic structures at at least two measurement directions, each periodic structure comprising at least two types of periodically arranged target elements, wherein at least one type thereof is common to at least two of the at least two periodic structures.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 3A and 3B are high level schematic conceptual illustrations of SCOL targets and resulting pupil plane scatterometry images, according to some embodiments of the invention.

DETAILED DESCRIPTION OF THE INVENTION

Figure 1:
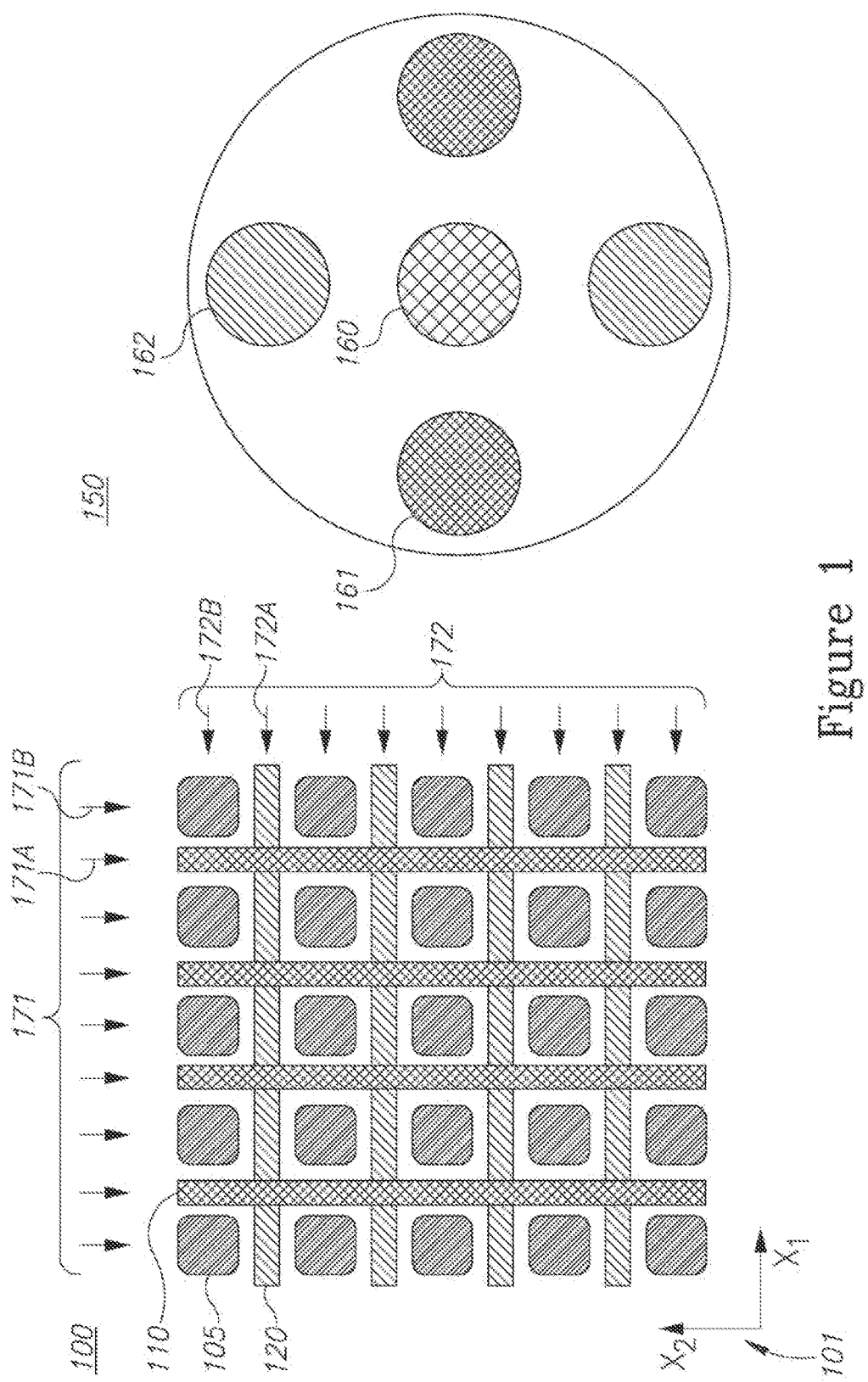
FIG. 1 is a high level schematic illustrations of a SCOL target and of a resulting pupil plane scatterometry image, according to some embodiments of the invention.

Prior to the detailed description being set forth, it may be helpful to set forth definitions of certain terms that will be used hereinafter.

The terms "metrology target" or "target" as used herein in this application, are defined as structures designed or produced on a wafer which are used for metrological purposes. The term "target element" as used herein in this application, is defined as a feature in the metrology target such as individual target areas or boxes, grating bars etc. Target elements may be full or empty (gaps), and may also be segmented, i.e., may comprise multiple smaller features which cumulatively constitute the target element. A target is referred to as comprising target elements, each "target element" being a feature of the target that is to be distinguished from its background, the "background" being a wafer area proximate to a target element on the same or on a different layer (above or below the target element). The term "layer" as used herein in this application, is defined as any of the layers used in a photolithography process in any of its steps. Examples for layers, which are used in a non-limiting manner in the present disclosure include resist layers, layers after etching, oxide or oxide diffusion (OD) layers, polysilicon (poly) layers, contact layers, via layers etc.

The term "periodic structure" as used in this application refers to any kind of designed or produced structure in at least one layer which exhibits some periodicity. The periodicity is characterized by its pitch, namely its spatial frequency. For example, a bar as a target element may be produced as a group of spaced parallel lines, thereby reducing the minimal feature size of the element and avoiding monotonous regions in the target. Target elements may comprise segments which are uniform or segments or varying shape, e.g., having periodically alternating forms. Segments of target elements may be shared with other target elements, e.g., ones participating in structure having a different measurement direction.

The term "measurement direction" as used in this application refers to the direction along which the periodic structure is periodic. For example, the measurement direction of a grid as the periodic structure is perpendicular to the target elements (e.g., bars or segmented bars) which constitute the grid. The term "array" as used in this application refers to a two-dimensional set of elements which is substantially invariant under translation along at least two directions. The term "symmetry direction" with respect to an array of elements, as used in this application, refers to a direction along which the array is invariant under translation, ignoring the boundaries of the array (relating to the array as if it were infinite).

The term "segment" as used in this application refers to any non-segmented feature is part of a (segmented) target element. Segments such as pivoting elements may have specified forms and specified spaces among themselves and in relation to adjacent structures and elements. The term "pivoting element" as used in this application refers to target elements or segments thereof which are common to two or more periodic structures, without any a priori limitation regarding its dimensions or form.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings is intended to make apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments, and is capable of being practiced or carried out in various ways. Also, it is to be understood that the phraseology and terminology employed herein is for the purpose of description and should not be regarded as limiting.

Scatterometry overlay (SCOL) targets as well as design, production and measurement methods thereof are provided. The SCOL targets have several periodic structures at different measurement directions which share some of their structural target elements or parts thereof. An array of common elements may have symmetry directions which are parallel to the measurement directions and thus enable compacting the targets or alternatively increasing the area use efficiency of the targets. Various configurations enable high flexibility in arranging the number of layers in the target and measurement directions, and carrying out respective overlay measurements among the layers.

Provided are scatterometry overlay (SCOL) targets, related target design files, and design, production and measurement methods, which comprise at least two periodic structures in at least two measurement directions, each periodic structure comprising at least two types of periodically arranged target elements, wherein at least one type thereof is common to at least two of the at least two periodic structures. Also provided are scatterometry overlay (SCOL) targets, and related target design files, and design, production and measurement methods, which comprise at least two periodic structures in at least two measurement directions, each periodic structure comprising a plurality of periodically arranged target elements, and an array of pivoting elements, each pivoting element positioned between a pair of adjacent target elements with respect to each of the periodic structures. Exemplary, non-limiting, target designs are illustrated in the following FIGS. 1, 2, 3A and 3B, following by design principles applicable to such SCOL targets and allowing the design of a multitude of SCOL targets according to specified requirements, all of which are to be considered part of the present disclosure. The dimensions and spacing among target elements and among diffraction images all through the figures are not to be understood as limiting the scope of the invention but merely as illustrating the disclosed design principles.

FIG. 1 is a high level schematic illustration of a SCOL target 100 and of resulting pupil plane scatterometry image 150, according to some embodiments of the invention. FIG. 1 illustrates SCOL target 100 comprising periodic structures 171, 172 at two measurement directions 101 (denoted $X_1$, $X_2$, in this case perpendicular). Each periodic structure 171, 172 comprises two types A, B (171A, 171B and 172A, 172B, respectively) of periodically arranged target elements 110, 120, 105. Type B (171B, 172B comprising elements 105) is common to (i.e., shared by) both periodic structures 171, 172. As a matter of non-limiting illustrative convenience, target elements of the common type are referred to as pivoting elements 105.

It is noted that pivoting elements 105 may contribute to the scatterometry diffraction pattern and thus function as segmented periodic structures in the respective direction. Pivoting elements 105 may be introduced in any layer, e.g., into the last resist layer or any other layer before the resist layer. Metrology measurements may be carried out at any production stage, e.g., after etch. In certain embodiments, targets 100 may be used to measure overlays of via layer(s) with respect to metal or contact layers.

In certain embodiments, the array of pivoting elements 105 may comprise two or more sub-arrays of pivoting elements 105 with each sub-array located at a different layer. Such array may be used for scatterometry measurements between the layers, with or without additional target elements 110, 120, 130. In such embodiments, one or more array may comprise two or more sub-arrays which are measurable in one, two or more directions. Such arrays may be seen as segmented bars (or other originally continuous structures) which are modified by the segmentation pattern to be measurable in two or more measurement directions.

It is further noted that at least three main characteristics of pivoting elements 105 may be configured and adapted with respect to specifications. One such characteristic is the array configuration of pivoting elements 105 and particularly its symmetry directions, i.e., the directions along which the array is invariant under translation (when relating to the array as if it were infinite). Another such characteristic is the distribution of pivoting elements 105 among target layers, which determine the relation in production (physical, chemical and geometric parameters) between pivoting elements 105 and periodic structures 171, 172. A third characteristic is the form of individual pivoting elements 105, which may have symmetry axes along at least some of the measurement directions X, in order to reach efficient packing and production of pivoting elements 105. Considerations and design principles concerning these characteristics are elaborated below in a non-limiting illustrative manner.

Pupil image 150 illustrates the zeroth order diffraction signal 160 and well as ±1 first order diffraction signals 161, 162 from periodic structures 171, 172 respectively. In the illustrated case, with perpendicular measurement directions $X_1$, $X_2$, target 100 can be measured in the x and y directions to yield simultaneous scatterometry measurements of both axes. In the illustrated example, pivoting elements 105 may be configured to contribute (depending on their dimensions and arrangement) to the scatterometry diffraction pattern in either or both directions.

In such cases, pivoting elements 105 are part of respective periodic structures 171, 172, and the respective periodic structures 171, 172 is thus composed of two types of target elements—110, 105 and/or 120, 105, respectively. In particular, in cases pivoting elements 105 may be configured as elements common to (shared by) both periodic structures 171, 172.

Figure 2:
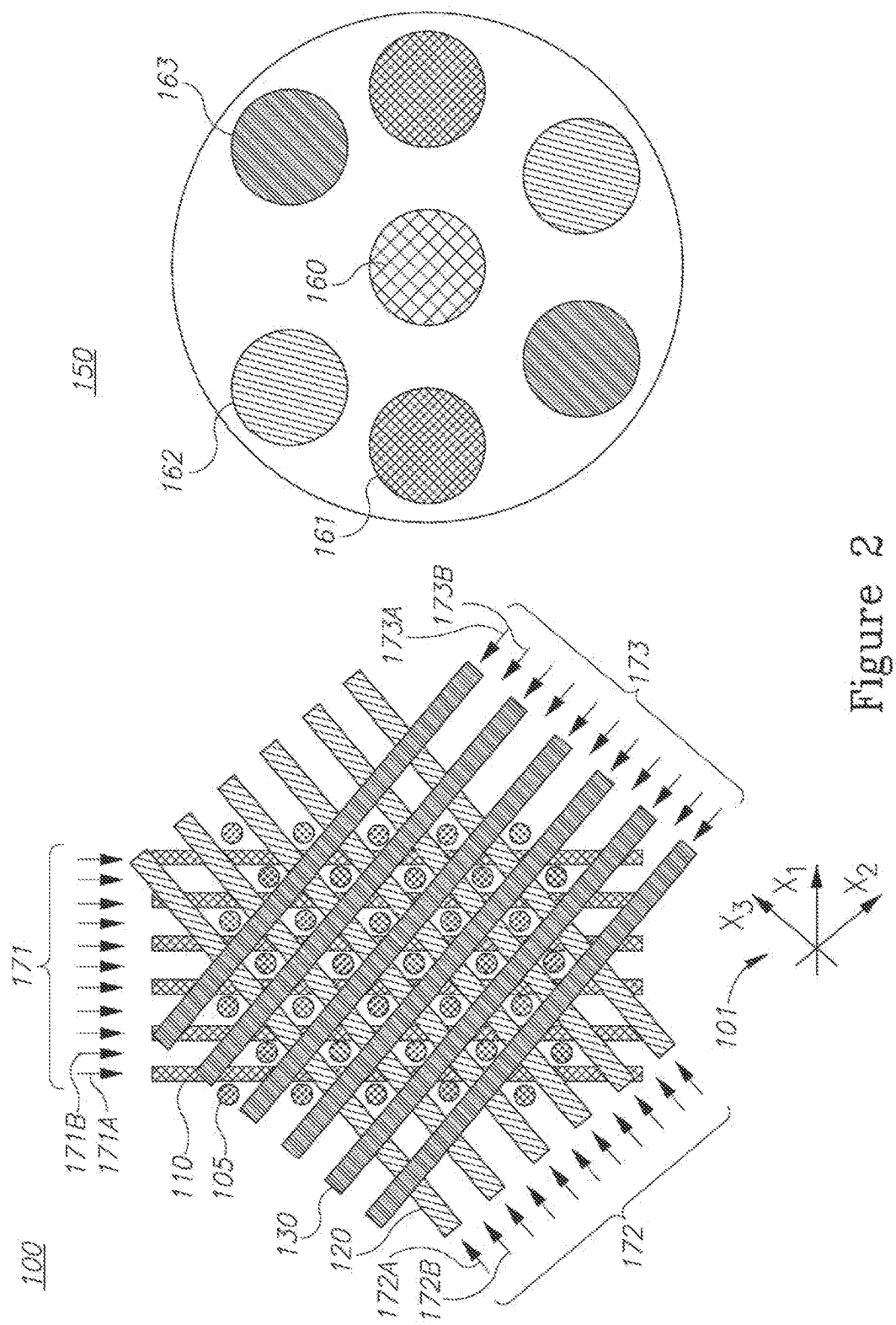
FIG. 2 is a high level schematic illustrations of a SCOL target and of a resulting pupil plane scatterometry image, according to some embodiments of the invention.

FIG. 2 is a high level schematic illustration of SCOL target 100 and of resulting pupil plane scatterometry image 150, according to some embodiments of the invention. FIG. 2 illustrates SCOL target 100 comprising periodic structures 171, 172, 173 at three measurement directions 101 (denoted $X_1$, $X_2$, $X_3$). Each periodic structure 171, 172, 173 comprises two types A, B (171A, 171B; 172A, 172B and 173A, 173B, respectively) of periodically arranged target elements 110, 120, 130, 105. Type B (171B, 172B, 173B comprising elements 105) is common in the illustrated case to all three periodic structures 171, 172, 173. However, in certain embodiments, Type B may be common to a subset of layers. In certain embodiments, different Type B elements may be designed in different layers. As a matter of non-limiting illustrative convenience, target elements of the common type are referred to as pivoting elements 105.

As stated above, pivoting elements 105 may contribute to the scatterometry diffraction pattern and thus function as segmented periodic structures in the respective direction. As before, any of the presented characteristics of pivoting elements 105, namely the array configuration and symmetry directions of pivoting elements 105, the distribution of pivoting elements 105 among target layers and the form of individual pivoting elements 105, may be configured and adapted with respect to specifications.

Pupil image 150 illustrates zeroth order diffraction signal 160 and well as ±1 first order diffraction signals 161, 162, 163 from periodic structures 171, 172, 173 respectively. In the illustrated case, target 100 may be measured in measurement directions $X_1$, $X_2$, $X_3$ to yield simultaneous scatterometry measurements of all three axes. Pivoting elements 105 may be configured to contribute (depending on their dimensions and arrangement) to the scatterometry diffraction pattern in any number of the directions by being part of respective periodic structures 171, 172, 173 which are in turn composed of two types of target elements—110, 105, 120, 105 and/or 130, 105, respectively. In particular, pivoting elements 105 may be configured as elements common to all periodic structures 171, 172, 173, or in general as common element of some or all periodic structures in a given target.

Pivoting elements 105 may interspace adjacent target elements 110, 120, 130 of periodic structures 171, 172, 173 respectively. The interspacing may be full, i.e., no overlap may be present between pivoting elements 105 adjacent target elements 110, 120, 130, or the interspacing may be partial, i.e. some overlapping may be allowed, depending on specified requirements. In certain cases or for certain pivoting elements 105, overlap with other target elements 110, 120, 130 may be significant or even full, depending on target design and required metrology measurements. The array of pivoting elements 105 may be uniform throughout target 100, or the array may comprise sub regions with differing characteristics of pivoting elements 105.

FIGS. 3A and 3B are high level schematic conceptual illustrations of SCOL targets 100 and resulting pupil plane scatterometry images 150, according to some embodiments of the invention. FIGS. 3A and 3B illustrate SCOL targets 100 comprising periodic structures 171, 172, 173 at three measurement directions 101 (denoted $X_1$, $X_2$, $X_3$). Each periodic structure 171, 172 comprises two types A, B (171A, 171B and 172A, 172B, respectively) while periodic structure 173 comprises on type A (173A) in FIG. 3A and two types A, B (173A, 173B, respectively) in FIG. 3B, of periodically arranged target elements 110, 120; 130, 105. Type B (171B, 172B, 173B comprising elements 105) is common in the illustrated cases to all three periodic structures 171, 172, 173. Moreover, in the illustrated cases three type of segmented target elements 110, 120 are shown in which hexagonally-illustrated elements 105 are common to two or three target elements, depending on their dimensions, configuration and on the measurement configuration, for example, as elements 171B and 172B (measurement directions $X_1$ and $X_2$ respectively) in FIG. 3A and as elements 171B, 172B and partially 173C (measurement directions $X_1$, $X_2$ and $X_3$ respectively) in FIG. 3B. It is further noted that pivoting elements 105 may participate in building target elements, as illustrated in target elements 173B in FIG. 3B, which are composed of alternating hexagonally-illustrated pivoting elements 105 and square target element segments 110. Sizes of any of the elements and the spaces between elements may be calculated according to geometrical and optical considerations, FIGS. 3A and 3B serve merely rough conceptual illustrations which are non-limiting.

Any of the target types, which may be more numerous than two, may be common to a subset of target elements and/or to a subset of layers. In certain embodiments, different Type B elements may be designed in different layers. As a matter of non-limiting illustrative convenience, target elements of the common type are referred to as pivoting elements 105. Several types of pivoting elements 105 may be used, according to target design considerations and pivoting elements 105. In certain embodiments, the array of pivoting elements 105 may comprise two or more sub-arrays of pivoting elements 105 with each sub-array located at a different layer. Such array may be used for scatterometry measurements between the layers, with or without additional target elements 110, 120, 130. For example, in FIG. 3A, any of arrays 105, 110, 120 may be designed in multiple layers and the respective elements may be used to carry out scatterometry measurements with respect to these layers.

In certain embodiments, pivoting elements 105 may be produced after some or all of other target elements 110, 120, 130, e.g., in order to assure correct positioning of pivoting elements 105.

Pivoting elements 105 may have symmetry directions which correspond to the measurement directions. For example, in the illustrated case pivoting elements 105 are square (FIG. 1), circular (FIG. 2), hexagonal (FIGS. 3A, 3B), etc. The measurements directions may be perpendicular (90° to each other, as illustrated e.g. in FIG. 1), or build any angle, depending of measurement and production considerations, e.g., 30°, 45°, 60°, or any other angle (see e.g., FIGS. 2, 3A, 3B). In certain embodiments, any of the disclosed targets may have a 180° rotational symmetry. Targets 100 may have one, two, three, or more reflection symmetries, i.e., targets 100 may be reflection-symmetric with respect to multiple reflection planes through targets 100. Targets 100 may have a 30°, 45°, 60°, and/or 120° rotational symmetry. Any of the pitches of the periodic structures, the measurement wavelengths and pupil plane parameters may be adjusted to required measurement specifications, in order to maintain required measurement orders within the pupil plane. Metrology measurements may comprise blocking certain orders in certain stages of the measurement. In certain embodiments, illumination may not be annular, but be of dipole, quadruple, or other illumination type. The illumination type and illumination directions may be adjusted according to symmetry considerations regarding targets 100 and with respect to the targets' measurement directions $X_i$. In certain embodiments, design details and measurement directions $X_i$ of targets 100 may be configured according to given parameters, directions and patterns of illumination.

As stated above, pivoting elements 105 may contribute to the scatterometry diffraction pattern and thus function as segmented periodic structures in the respective direction.

As before, any of the presented characteristics of pivoting elements 105, namely the array configuration and symmetry directions of pivoting elements 105, the distribution of pivoting elements 105 among target layers, and the form of individual pivoting elements 105, may be configured and adapted with respect to specifications.

Pupil image 150 illustrates zeroth order diffraction signal 160 and well as ±1 first order diffraction signals 161, 162, 163 from periodic structures 171, 172, 173 respectively. In the illustrated cases, target 100 may be measured in measurement directions $X_1$, $X_2$, $X_3$ to yield simultaneous scatterometry measurements of two or three axes. Pivoting elements 105 may be configured to contribute (depending on their dimensions and arrangement) to the scatterometry diffraction pattern in any number of the directions by being part of respective periodic structures 171, 172, 173 which are in turn composed of two types of target elements—110, 105; 120, 105 and/or 130, 105, respectively. In particular, pivoting elements 105 may be configured as elements common to all periodic structures 171, 172, 173, or in general as common element of some or all periodic structures in a given target.

Pivoting elements 105 may interspace adjacent target elements 110, 120, 130 of periodic structures 171, 172, 173 respectively. The interspacing may be full, i.e., no overlap may be present between pivoting elements 105 adjacent target elements 110, 120, 130, or the interspacing may be partial, i.e. some overlapping may be allowed (see e.g., FIG. 3B), depending on specified requirements. In certain cases or for certain pivoting elements 105, overlap with other target elements 110, 120, 130 may be significant or even full, depending on target design and required metrology measurements. The array of pivoting elements 105 may be uniform throughout target 100, or the array may comprise sub regions with differing characteristics of pivoting elements 105.

Targets 100 may be based on given models of SCOL targets which are modified according to the above-disclosed principle for different purposes such as enhancement of producibility, compaction the targets, addition of measurement directions etc. For example certain periodic structures in existing targets may be transformed into an array of pivoting elements 105 and condensed with respect to each other until pivoting elements 105 become common elements of different periodic structure—that is at least partially overlap.

Any of target elements 110, 120, 130, 105 may be applied as a positive or a negative element. Any of target elements 110, 120, 130, 105 may full, gap (as gaps in a full or segmented background) and/or segmented, i.e., constructed of still smaller segments. The pitches of any of the segmentation patterns may vary, particularly of segmentation patterns in different regions of each layer. The order of layers and of periodic structure is non-limiting and may be modified according to specific target designs. Periodic structures 171, 172, 173 may be at respective separate layers, or any of the periodic structures may be in the same layer. Clearly, more than three periodic structures may be design in target 100. Pivoting elements 105 may be in a single or in multiple layers, with full, partial or no overlap between pivoting elements 105 of different layer.

Target design files for producing targets 100 are likewise considered part of the present invention, as are any design adaptations carried out to make the illustrated conceptual designs compatible with production design rules. Scatterometry measurements of any of SCOL targets 100 represented herein are also part of the present disclosure, and in particular simultaneous scatterometry measurements in different directions of the pupil plane.

Disclosed methods comprise configuring pivoting elements, selected from a plurality of target elements in a SCOL target, to be common to at least two periodic structures having different measurement directions. Methods may further comprise generating target design files of the respective SCOL targets and target design files generated according to the disclosed methods. Methods may further comprise producing the SCOL targets and SCOL targets produced according to the disclosed methods. Methods may further comprise aligning the at least two periodic structures according to the pivoting elements. Methods may further comprise measuring diffraction patterns of the SCOL target and scatterometry measurements resulting from SCOL targets produced by the disclosed methods.

The methods may further comprise configuring the pivoting elements as an array having symmetry directions which are parallel to the measurement directions. The methods may further comprise interspacing adjacent target elements of the at least two periodic structures by the pivoting elements. The methods may further comprise designing the pivoting elements at target layers holding the periodic structures, and producing the pivoting elements at one or more layers by one or more exposures (not necessarily respectively). The methods may further comprise configuring the at least two periodic structures to generate distinct first order diffraction patterns at a pupil plane of a specified measurement tool.

Figure 4:
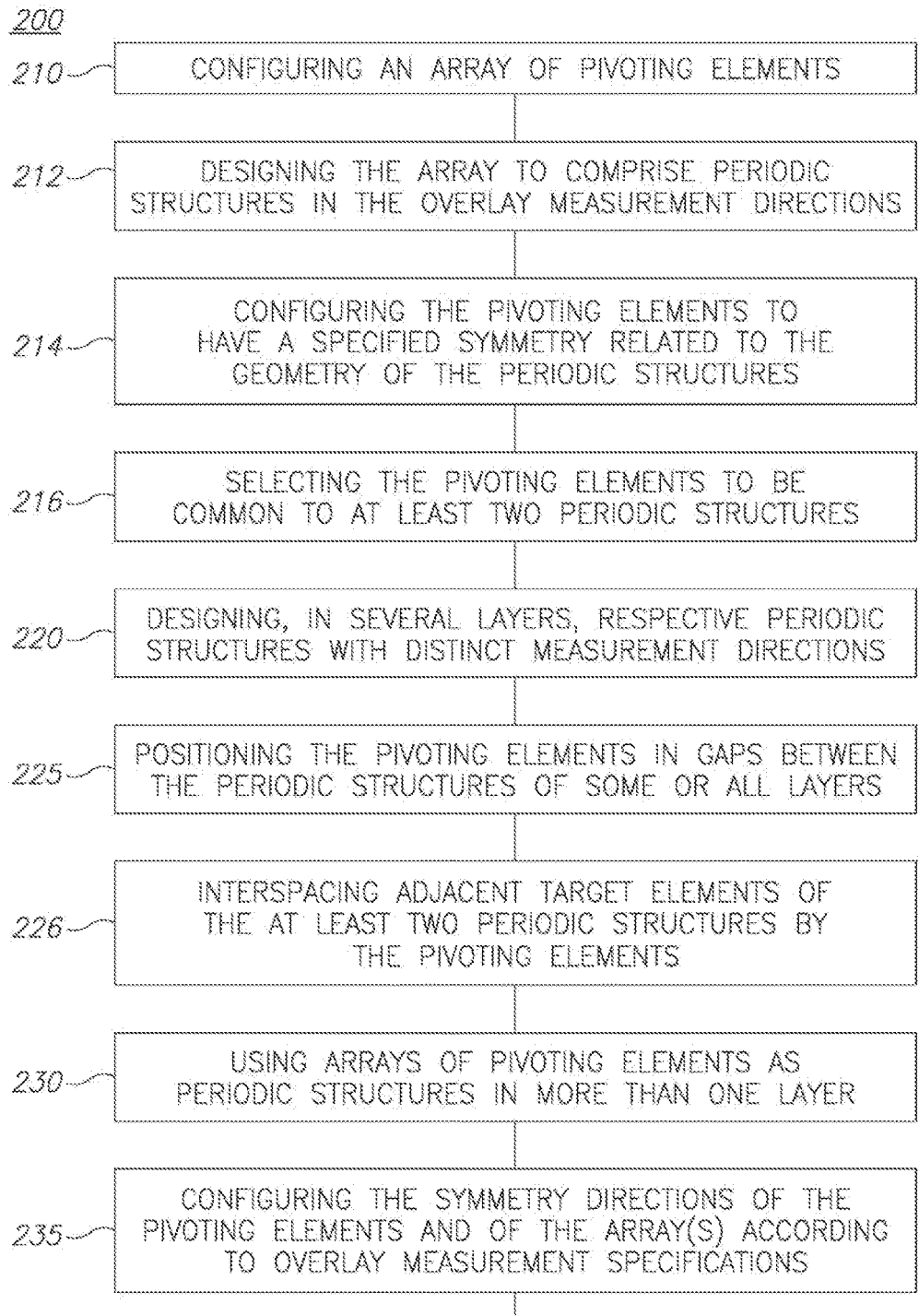
FIG. 4 is a high level flowchart illustrating a method, according to some embodiments of the invention.

FIG. 4 is a high level flowchart illustrating a method 200, according to some embodiments of the invention. Method 200 may comprise stages for designing and or producing targets 100, such as any of the following stages, irrespective of their order. Any of the designing and the configuring stages may be carried out by at least one computer processor. Certain embodiments comprise computer program products comprising a computer readable storage medium having computer readable program embodied therewith. The computer readable program may be configured to carry out stages of method 200. Also provided are design files which are produced according to stages of method 200. Certain embodiments comprise a computer program product comprising a computer readable storage medium having computer readable program embodied therewith. The computer readable program may be configured to carry out metrology measurements of targets 100 or any targets produced according to method 200.

Method 200 may comprise providing an array of pivoting elements (stage 210), using arrays of pivoting elements as periodic structures in more than one layer (stage 220), designing, in several layers, respective periodic structures with distinct measurement directions (stage 230) and selecting the measurement directions to parallel symmetry directions of the array of pivoting elements (stage 240).

In certain embodiments, method 200 may comprise designing the array to comprise periodic structures in the overlay measurement directions (stage 212), configuring the pivoting elements to have a specified symmetry related to the geometry of the periodic structures (stage 214) and/or selecting the pivoting elements to be common to at least two periodic structures (stage 216).

In certain embodiments, method 200 may comprise configuring the symmetry directions of the pivoting elements and of the array(s) according to overlay measurement specifications (stage 225). In certain embodiments, method 200 may comprise interspacing adjacent target elements of the at least two periodic structures by the pivoting elements (stage 226) and/or positioning the pivoting elements in spaces of the periodic structures of all layers (stage 235).

Method 200 may further comprise designing the periodic structures and/or the arrays to yield multiple (at least first order) diffraction signals along respective directions in the pupil plane (stage 245). Method 200 may further comprise generating corresponding target design files and producing the SCOL targets (stage 250).

Method 200 may further comprise extracting overlay data from several layers in a single target (stage 260), for example, measuring the overlay data simultaneously from different layers (stage 261) and/or measuring the overlay data from different layers sequentially (stage 262). Method 200 may further comprise producing the array of pivoting elements by multiple exposures (stage 255) and extracting the overlay data with respect to the corresponding exposure (stage 265).

In certain embodiments, the pitch of pivoting elements 105 in the array in any of the symmetry directions may be between 200 nm and 2000 nm.

Advantageously, targets 100 may be designed to comprise several layers and enable single or multiple measurements of one or more target cells. Moreover, overlay may be measured among any subset of target layers (e.g., overlay of one or more layers with respect to one or more layers). Target configurations reduce the size of the area occupied by the target (or alternatively allow using larger targets at a given area), reduce measurement time and enhance accuracy by carrying out multiple measurements at single targets.

In the above description, an embodiment is an example or implementation of the invention. The various appearances of "one embodiment," "an embodiment," "certain embodiments," or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A scatterometry overlay (SCOL) target comprising:
    a periodic structure including a plurality of target elements configured for measurements in a first measurement direction; and
    a plurality of pivoting elements disposed between the plurality of target elements,
    wherein:
        the SCOL target is embodied in a first layer; and
        the plurality of pivoting elements are configured to align with a plurality of pivoting elements in a second SCOL target embodied in a second layer when the SCOL target and the second SCOL target are angularly offset relative to each other.

2. The SCOL target of claim 1, wherein the target elements are segmented.

3. The SCOL target of claim 1, wherein the pivoting elements have symmetry which correspond to the measurement direction.

4. The SCOL target of claim 1, wherein the pivoting elements are circular.

5. The SCOL target of claim 1, wherein the SCOL target and the second SCOL target are angularly offset relative to each other by one of: 30°, 45°, 60°, and 90°.

6. The SCOL target of claim 1, wherein the plurality of pivoting elements are further configured to align with a plurality of pivoting elements in a third SCOL target when the SCOL target, the second SCOL target, and the third SCOL target are angularly offset relative to each other.

7. The SCOL target of claim 1, wherein at least some of the target elements are segmented.

8. The SCOL target of claim 1, wherein the periodic structure and plurality of pivoting elements are configured to generate distinct first order diffraction patterns at a pupil plane of a specified measurement tool.

9. A scatterometry overlay (SCOL) target comprising:
    a first periodic structure including a plurality of target elements configured for measurements in a first measurement direction;
    a second periodic structure including a plurality of target elements configured for measurement in a second direction; and
    a plurality of pivoting elements disposed between the plurality of target elements,
    wherein:
        the SCOL target is embodied in a first layer; and
        the plurality of pivoting elements are configured to align with a plurality of pivoting elements in a second SCOL target embodied in a second layer when the SCOL target and the second SCOL target are angularly offset relative to each other.

10. The SCOL target of claim 9, wherein the first measurement direction and second measurement direction are respectively at any of: 30°, 45°, 60°, and 90°.

11. The SCOL target of claim 9, further comprising a third periodic structure including a plurality of target elements configured for measurement in a third direction.

12. The SCOL target of claim 9, wherein the pivoting elements have symmetry directions which correspond to the measurement directions.

13. The SCOL target of claim 9, wherein the pivoting elements are circular.

14. The SCOL target of claim 9, wherein at least one of the target elements are segmented.

15. The SCOL target of claim 9, wherein the first periodic structure, second periodic structure, and plurality pivoting elements are configured to generate distinct first order diffraction patterns at a pupil plane of a specified measurement tool.

16. A method for aligning two or more periodic structures in at least one scatterometry overlay (SCOL) target comprising aligning a first plurality of pivoting elements disposed between target elements in a first periodic structure having a first measurement direction with a second plurality of pivoting elements disposed between target elements in a second periodic structure having a second measurement direction,
    wherein:
        the first plurality of pivoting elements and second plurality of pivoting elements are configured to align when the first periodic structure and second periodic structure are angularly offset.

17. The method of claim 16, wherein the first plurality of pivoting elements and first plurality of pivoting elements have symmetry directions which are parallel to the measurement directions.

18. The method of claim 16, wherein the pivoting elements are segmented periodic structures.

19. The method of claim 16, wherein the first periodic structure and second periodic structure are disposed in separate target layers.

20. The method of claim 16, further comprising generating distinct first order diffraction patterns at a pupil plane of a specified measurement tool.

21. The method of claim 16, further comprising generating a target design file of the SCOL target.

22. The method of claim 16, further comprising producing the SCOL target.

23. A SCOL target produced according to the method of claim 22.

24. The method of claim 16, further comprising producing the pivoting elements by multiple exposures.

25. The method of claim 16, further comprising measuring one or more diffraction patterns of the SCOL target.

26. A computer program product comprising a computer readable storage medium having a computer readable program embodied therewith, the computer readable program configured to carry out the method of claim 16.

* * * * *